United States Patent [19]

Rösner

[11] Patent Number: 5,270,236
[45] Date of Patent: Dec. 14, 1993

[54] METHOD FOR PRODUCING AN OPENING IN A LAYERED SEMICONDUCTOR STRUCTURE OR A CONTACT HOLE IN AN INTEGRATED CIRCUIT OR DRAM

[75] Inventor: Wolfgang Rösner, Neubiberg, Fed. Rep. of Germany

[73] Assignee: Siemens Aktiengesellschaft, Munich, Fed. Rep. of Germany

[21] Appl. No.: 692,257

[22] Filed: Apr. 26, 1991

[30] Foreign Application Priority Data

Apr. 27, 1990 [DE] Fed. Rep. of Germany ....... 4013629

[51] Int. Cl.⁵ .......................................... H01L 27/108
[52] U.S. Cl. ........................................ 437/48; 437/47; 437/52; 437/228
[58] Field of Search ................ 437/228, 52, 48, 43, 437/41, 47; 148/DIG. 100; 357/23.6, 51

[56] References Cited

U.S. PATENT DOCUMENTS

| | | | |
|---|---|---|---|
| 4,569,119 | 2/1986 | Terada et al. | 437/228 |
| 4,728,621 | 3/1988 | Graf et al. | 437/41 |
| 4,740,480 | 4/1988 | Ooka | 437/41 |
| 4,826,781 | 5/1989 | Asahina et al. | 437/48 |
| 4,843,024 | 6/1989 | Ito | 148/DIG. 100 |
| 4,988,403 | 1/1991 | Matuo | 437/231 |
| 4,992,389 | 2/1991 | Ogura et al. | 437/43 |
| 4,992,394 | 2/1991 | Kostelak et al. | 437/228 |

FOREIGN PATENT DOCUMENTS

| | | |
|---|---|---|
| 0439965 | 8/1991 | European Pat. Off. . |
| 62-86853 | 4/1987 | Japan . |
| 1-155656 | 6/1989 | Japan . |

OTHER PUBLICATIONS

K. H. Küsters et al: Journal de Physique, Coll. C4, Suppl. aun=9, Tome 49, C4-503-C4-506 (date unknown).

*Primary Examiner*—Olik Chaudhuri
*Assistant Examiner*—Richard Booth
*Attorney, Agent, or Firm*—Herbert L. Lerner; Laurence A. Greenberg

[57] ABSTRACT

The method produces an opening in a layered semiconductor structure having a site intended for an opening. A place-saver is produced on the structure from a first material to be selectively etched to the structure under the first material and to a material adjacent the site. A layer of a second material to which the first material is selectively etchable, is produced over the entire surface of the structure having the place-saver. The opening is formed by at least partially removing the layer of the second material above the place-saver, and removing the place-saver by selective etching.

8 Claims, 2 Drawing Sheets

METHOD FOR PRODUCING AN OPENING IN A LAYERED SEMICONDUCTOR STRUCTURE OR A CONTACT HOLE IN AN INTEGRATED CIRCUIT OR DRAM

The invention relates to a method for producing an opening in a layered semiconductor structure or a contact hole in an integrated circuit or dram.

It is well known to use a photoresist mask for producing openings with the aid of etching processes in a layered semiconductor structure. A photoresist mask is made from a layer of photoresist that is exposed through a projection mask. The projection mask must be adjusted to the layered semiconductor structure. Due to unavoidable tolerances in adjustment, a safety spacing must be adhered to between the location provided for the opening and adjacent components in the layered semiconductor structure. For instance, an opening that is used as a contact hole for a bit line contact in a DRAM must be located a safe distance way from the word line, in accordance with the given edge position accuracy.

When making openings that are used as contact holes, a problem which particularly arises is that the opening is made in a passivation layer that also covers adjacent components and serves as insulation between the adjacent components and a contact made in the contact hole. When making the opening, a danger therefore exists of parts of adjacent components being exposed by etching, which leads to short-circuiting once the contact has been finished.

In order to enable a higher scale of integration to be attained in semiconductor circuits, the safety distance between adjacent components and the opening must be reduced.

A self-adjusted production method for a contact hole in a 4-megabit DRAM is known from an article by K. H. Küsters et al in the Journal de Physique [Journal of Physics], coll. C4, supplement to No. 9, Vol. 49, (1988), pages C4-503 through C4-506. Safety spacings for adjustment tolerances can be dispensed with by using self-adjusting production methods. In the known method, before a planarizing boron phosphorous silicate glass layer is deposited, one or more auxiliary layers are applied as an etching stop, to prevent exposure of the word line by etching. The contact hole is then etched into the boron phosphorous silicate glass layer. If the boron phosphorous silicate glass is wet-etched in the process, a very large lateral etching results. If the boron phosphorous silicate glass is dry-etched, the limiting etching selectivity of the boron phosphorous silicate glass with respect to the etching stop produces a thinning of the insulation from the word line. A compromise must therefore be made in the etching time, between a clean opening of the contact hole and the remaining thickness of the insulation on the word line.

It is accordingly an object of the invention to provide a method for producing an opening in a layered semiconductor structure or a contact hole in an integrated circuit or dram, which overcomes the hereinafore-mentioned disadvantages of the heretofore-known methods of this general type and which is also suitable for openings that overlap adjacent structures. In particular, the method should be suitable for producing contact holes.

With the foregoing and other objects in view there is provided, in accordance with the invention:

a) on a structure, at a site intended for the opening, a place-saver is produced from a first material that can be selectively etched to the underlying structure and to material that is adjacent the finished opening;

b) on the structure having the place-saver, a layer of a second material, to which the first material is selectively etchable, is produced over the entire surface;

c) the opening is produced due to the fact that the layer of the second material is at least partially removed above the place-saver, and the place-saver is removed by selective etching.

A place-saver is produced before the layer is deposited, at the site at which the opening is intended in a layer. In this process the material for the place-saver is selected in such a way that it is selectively etchable down to the material surrounding the finished opening. Through the use of this step, which is essential to the invention, it is assured that the material of the place-saver is removed completely from the opening. Since on the other hand the first material which provides the place-saver is selectively etchable down to the structure beneath it, when the place-saver is produced, neither the underlying structure nor the place-saver, nor components adjacent the opening, are impaired by removal of material in an etching process.

If the surface of the structure does not adequately meet the condition for selectivity in etching of the first material, it is within the scope of the invention to make an auxiliary layer, to which the first material is selectively etchable, at least at the site intended for the opening.

The method is suitable for producing arbitrary openings in a layered semiconductor structure. The selection of the first material for the place-saver is made in view of the selection of the second material for the layer, in such a way that the first material is etchable to the second material with maximum possible selectivity. For example, polysilicon is used for the first material, and $SiO_2$ is used for the second, or $SiO_2$ is used for the first material and silicon for the second.

The method is particularly well suited to producing contact holes in passivation layers. In passivation layers being formed of a material that contains $SiO_2$, for instance boron phosphorous silicate glass, polysilicon is used as the first material for the place-saver. Since the use of the materials is standard in semiconductor technology, the use of this method has the advantage of not requiring any substantial restriction for the overall process from the etching selectivities.

Since the place-saver is etchable to the underlying structure with good selectivity, the shape and position of the place-saver are arbitrary. In particular, the place-saver may partly overlap adjacent components. With the method according to the invention, less space is therefore needed than in adjusting methods to make openings, in particular contact holes.

In accordance with another mode of the invention, there is provided a method which comprises removing the layer of the second material above the place-saver by back-etching the layer of the second material over the entire surface area.

In accordance with a further mode of the invention, there is provided a method which comprises producing the first material from polysilicon, and producing the second material an $SiO_2$-containing material.

In accordance with an added mode of the invention, there is provided a method which comprises producing an auxiliary layer to which the first material is selectively etchable, on the structure at least at the site intended for the opening, before the place-saver is produced.

In accordance with an additional mode of the invention, there is provided a method which comprises removing the auxiliary layer by anisotropic etching in the vicinity of the opening after the removal of the place-saver.

In accordance with yet another mode of the invention, there is provided a method which comprises producing the place-saver between adjacent protrusions in the surface of the structure with the place-saver laterally overlapping respective protrusions.

In accordance with yet a concomitant mode of the invention, there is provided a method which comprises producing a layer of the first material on the structure having the protrusions in its surface; producing a photoresist structure on the layer of the first material at the site intended for the opening, while leaving a portion of the layer of the first material not covered by the photoresist structure; completely removing the portion of the layer of the first material not covered by the photoresist structure to create the place-saver; and producing the layer of the second material after the removal of the photoresist structure.

With the objects of the invention in view there is also provided a method for producing contact holes for overlapping contacts in an integrated circuit or for bit line contacts in DRAMs.

Other features which are considered as characteristic for the invention are set forth in the appended claims.

Although the invention is illustrated and described herein as embodied in a method for producing an opening in a layered semiconductor structure or a contact hole in an integrated circuit or dram, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

DETAILED DESCRIPTION OF THE INVENTION

Figure 1:
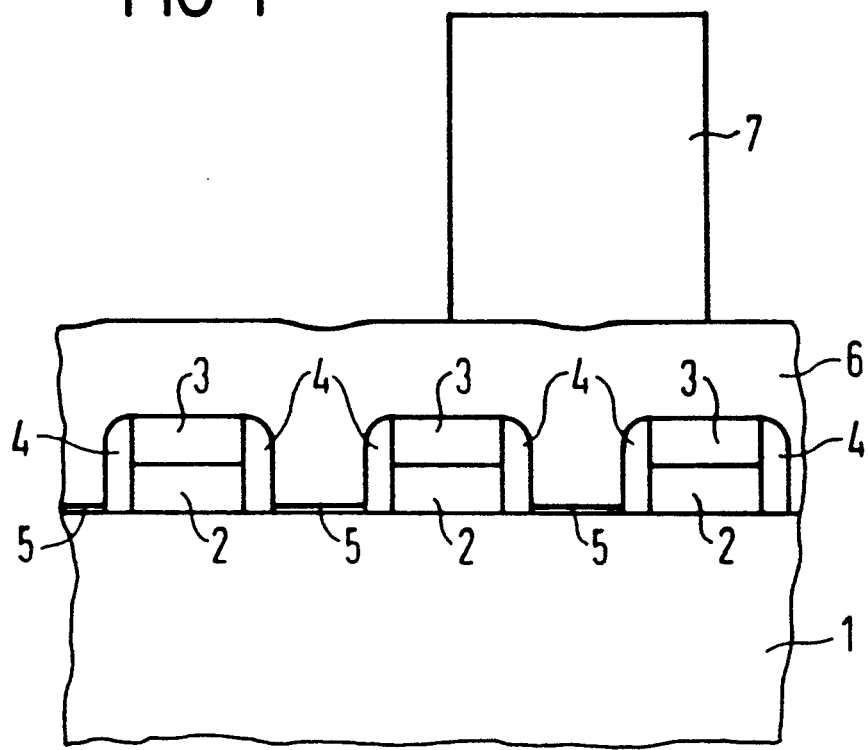
FIG. 1 is a fragmentary, diagrammatic, longitudinal-sectional view showing production of a place-saver.

Referring now to the figures of the drawing in detail and first, particularly, to FIG. 1 thereof, there is seen a structure that includes a substrate 1. The substrate 1 is formed of silicon and, for instance, has source regions, drain regions, channel implantations, and insulation structures separating active elements. Conductor tracks 2 are disposed on the substrate 1. The tracks 2 are generally separated from the substrate 1 by an insulation layer, for instance a gate oxide, which is not shown for the sake of simplicity. The tracks 2 are formed of electrically conductive material, such as doped polysilicon.

The tracks 2 may, for instance, represent word lines in a DRAM. $SiO_2$ structures 3 are disposed on a surface of the tracks 2 facing away or oriented away from the substrate 1. The $SiO_2$ structures 3 and the tracks 2 ar made from a corresponding double layer, in one and the same structuring step. Walls of the $SiO_2$ structures 3 and tracks 2 are provided with wall liners (or so-called spacers) 4. The wall liners 4 are made of $SiO_2$, for instance. The wall liners are produced by full-surface conformal deposition of an $SiO_2$ layer, for instance by thermal decomposition of $Si(OC_2H_5)_4$ (known as TEOS), at a thickness of 200 nm, for instance, with ensuing anisotropic back-etching of this layer. In the back-etching, the surface of the substrate 1 between adjacent wall liners 4 outside the tracks 2 is exposed or laid bare by etching. The exposed surface of the substrate 1 is provided with an oxide film 5. For instance, the oxide film 5 may be produced by thermal oxidation at 900° C. with 3% HCl, or by thermal decomposition of TEOS, at a thickness of 20 nm (see FIG. 1).

The structure including the substrate 1, the tracks 2, the $SiO_2$ structures 3, the wall liners 4 and the oxide film 5 has continuous $SiO_2$ on its surface. A layer 6, for instance of polysilicon, is produced over the entire surface of this structure. The layer 6 has a thickness of 700 nm, for instance. The layer 6 can be deposited either doped or undoped. Polysilicon has the property of being etchable with good selectivity of approximately 30:1 to $SiO_2$ in the anisotropic etching process using $Cl_2$/He.

A photoresist structure 7 is produced on the layer 6. The photoresist structure 7 covers the region of the layer 6 in which an opening is to be made.

In an anisotropic etching process, the layer 6 is etched back outside the photoresist structure 7. An example of a suitable etching process is dry etching with $Cl_2$/He. Outside the photoresist structure 7, the surface of the $SiO_2$ structures, the wall liners 4 and the oxide film 5 are exposed. In order to assure complete removal of the layer 6 of polysilicon even in the corners formed by the wall liners 4 and the oxide film 5, 100% re-etching must be performed.

Figure 2:
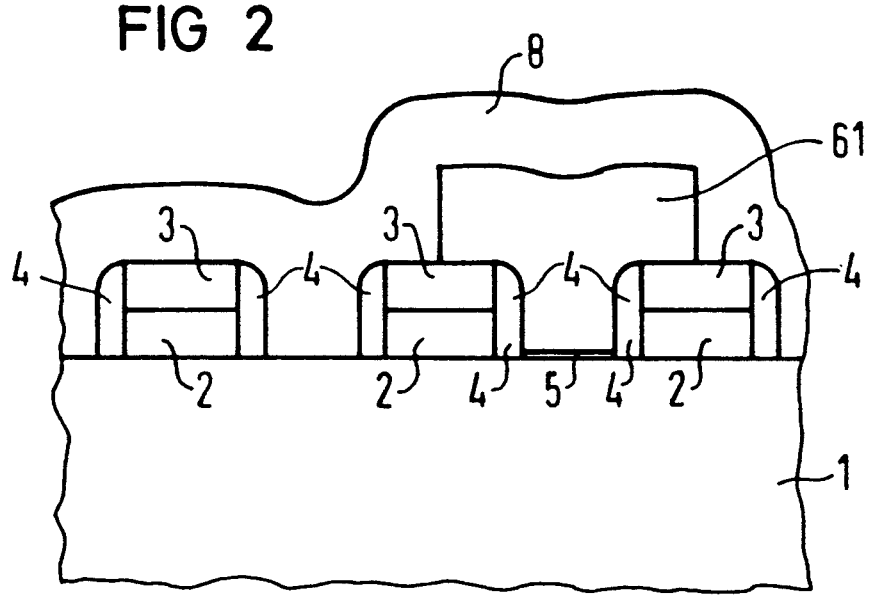
FIGS. 2 and 3 are views similar to FIG. 1 showing the place-saver covered with a layer of a second material.

Since the etching, process being used has a selectivity of 30:1 of polysilicon to $SiO_2$, this re-etching is possible without having to fear damage to previously exposed $SiO_2$ structures. During this structuring step, a place-saver 61 (see FIG. 2) is created from the polysilicon layer 6.

Oxide films 5 that are not covered by the place-saver 61 can be removed in an etching process that is selective to the substrate surface. A passivation layer 8, which may be formed of boron phosphorous silicate glass, for instance, is applied to the entire surface areas on the resultant surface. The passivation layer 8 is made in a thickness of 700 nm, for example, by thermal decomposition of TEOS, with a doping of 4.3% by weight of boron and 4.3% by weight of phosphorous.

Figure 3:
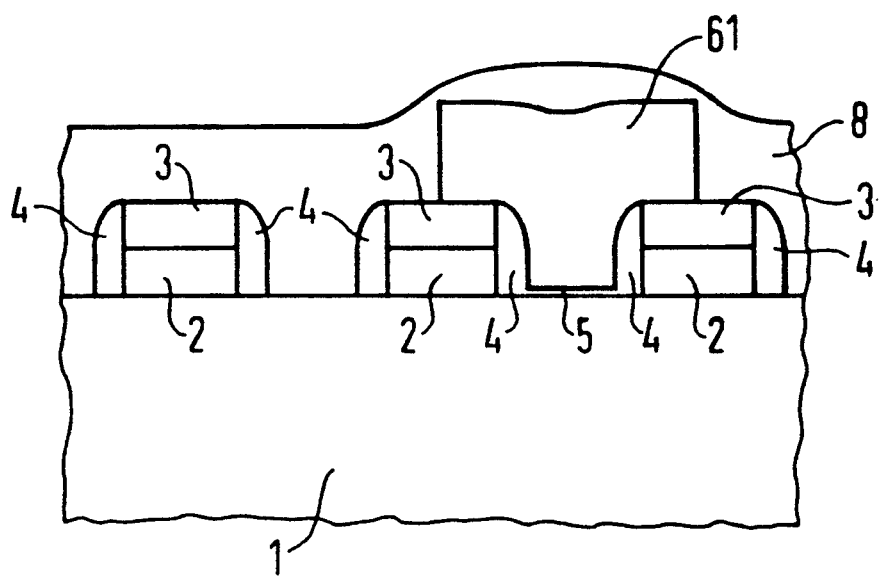

In a flow process at a temperature of 900° C., for instance, for 40 minutes, for instance, the passivation layer 8 is planarized (see FIG. 3). In this process the thickness of the passivation layer 8 above the place-saver 61 decreases, while in some regions outside the place-saver 61 it increases.

Figure 4:
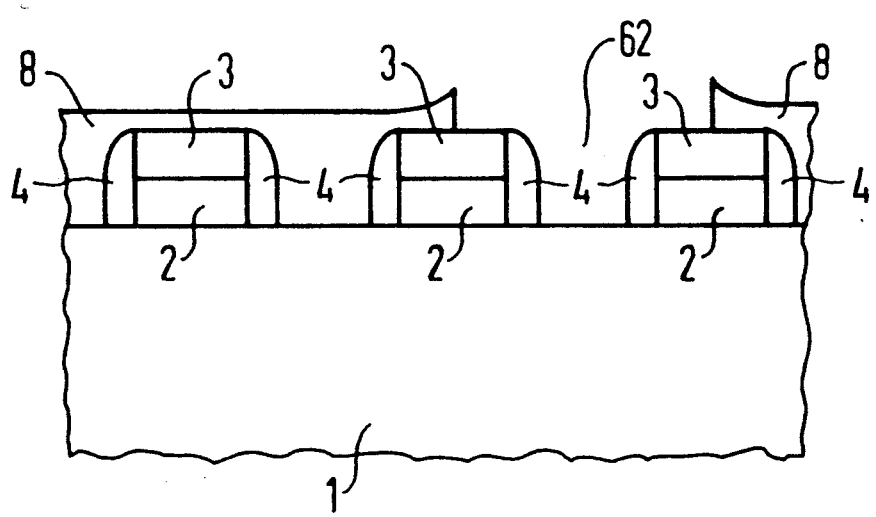
FIG. 4 is another fragmentary, longitudinal-sectional view showing a finished opening in the layer of the second material.

After exposure of the back of the semiconductor wafer by etching, which is technologically necessary, and in which the front is protected with a non-illustrated photoresist, the passivation layer 8 is etched back, after removal of the protecting photoresist, by approximately 500 nm, for instance. In this process at least the corners of the place-saver 61 are exposed. The place-saver 61 of polysilicon is etched out by wet chemical etching. The result is an opening 62 (see FIG. 4) in place of the place-saver 61. The wet chemical etching is, for instance, performed with choline (4%). It is extremely selective for SiO$_2$-containing material The oxide film 5 (see FIG. 3) is remove in the region of the opening 62 (see FIG. 4) in an anisotropic etching step.

The opening can subsequently be provided with metallizing in a known manner, for instance, for a non-illustrated bit line contact.

The etching steps necessary in the method according to the invention are each performed selectively for the existing layer beneath. The etching times for optimal structuring can be adjusted in each step. If the remaining layer of boron phosphorous silicate glass on the spacer-saver 61 after the flow process is fairly thick, exposure of the tracks 2 by etching can still be prevented by increasing the thickness of both the passivation layer and the SiO$_2$ structures 3. The use of a thicker passivation layer 8 has the advantage of flattening the sharp points of the passivation layer 8 that are created in the vicinity of the opening 62.

The materials used in the exemplary embodiment, namely polysilicon, silicon oxide and boron phosphorous silicate glass, and the etching methods used are all standard in semiconductor technology. The production method according to the invention can therefore be integrated into existing production processes without difficulty.

I claim:

1. A method for producing an opening in a layered semiconductor structure, which comprises, on a structure at a site intended for an opening:
    a) producing an auxiliary layer with respect to which polysilicon is selectively etchable on the structure at the site intended for the opening;
    b) producing a place-saver of polysilicon which is selectively etchable with respect to the structure under the place-saver and to a material adjacent the site;
    c) producing a passivation layer comprising SiO$_2$, with respect to which the place-saver is selectively etchable, over the entire surface of the structure having the place-saver and forming a portion of the passivation layer above the place-saver relatively thinner than remaining portions of the passivation layer;
    d) back-etching the passivation layer over the entire surface area and at least partially removing the passivation layer above the place-saver; and
    e) removing the place-saver by etching selectively with respect to the passivation layer.

2. The method according to claim 1, which comprises removing the layer of the second material above the place-saver by back-etching the layer of the second material over the entire surface area.

3. The method according to claim 1, which comprises removing the auxiliary layer by anisotropic etching in the vicinity of the opening after the removal of the place-saver.

4. The method according to claim 1, which comprises producing the place-saver between adjacent protrusions in the surface of the structure with the place-saver laterally overlapping respective protrusions.

5. The method according to claim 4, which comprises:
    a) producing a layer of the first material on the structure having the protrusions in its surface;
    b) producing a photoresist structure on the layer of the first material at the site intended for the opening, while leaving a portion of the layer of the first material not covered by the photoresist structure;
    c) completely removing the portion of the layer of the first material not covered by the photoresist structure to create the place-saver; and
    d) producing the layer of the second material after the removal of the photoresist structure.

6. A method for producing contact holes for overlapping contacts in an integrated circuit, which comprises, on an integrated circuit at a site intended for an opening:
    a) producing an auxiliary layer with respect to which polysilicon is selectively etchable on the structure at the site;
    b) producing a place-saver comprising polysilicon which is selectively etchable with respect to the integrated circuit under the place-saver and with respect to a material adjacent the site;
    c) producing a passivation layer comprising SiO$_2$, with respect to which the polysilicon is selectively etchable, over the entire surface of the integrated circuit having the place-saver and forming a portion of the passivation layer above the place-saver relatively thinner than remaining portions of the passivation layer;
    d) back-etching the passivation layer over the entire surface area;
    e) forming an opening in the passivation layer for forming the contact hole by at least partially removing the passivation layer above the place-saver; and
    f) removing the place-saver by etching selectively with respect to the passivation layer.

7. A method for producing contact holes for bit line contacts in DRAMs, which comprises, on a DRAM at a site intended for an opening:
    a) producing a place-saver from polysilicon to be selectively etched to the DRAM under the first material and to a material adjacent the site;
    b) producing a passivation layer of an SiO$_2$-containing material to which the polysilicon is selectively etchable, over the entire surface of the DRAM having the place-saver and forming a portion of the passivation layer above the place-saver relatively thinner than remaining portions of the passivation layer;
    c) back-etching the passivation layer over the entire surface area and forming an opening in the passivation layer for forming the contact hole by at least partially removing the passivation layer above the place-saver; and
    d) removing the place-saver by etching selectively to the passivation layer.

8. A method for producing a layered semiconductor structure with an opening, which comprises,
    a) producing a structure with a site intended for an opening and a material adjacent the site;
    b) producing a place-saver from polysilicon to be selectively etched to the structure under the polysilicon and to the material adjacent the site;
    c) producing a layer of SiO$_2$-containing material to which the polysilicon is selectively etchable, over the entire surface of the structure having the place-saver and forming a portion of the passivation layer above the place-saver relatively thinner than remaining portions of the passivation layer;

d) back-etching the passivation layer over the entire surface area and forming the opening in the passivation layer by at least partially removing the passivation layer above the place-saver; and e) removing the place-saver by selective etching selectively to the passivation layer.

* * * * *